United States Patent [19]

Kawai

[11] Patent Number: 5,369,050

[45] Date of Patent: Nov. 29, 1994

[54] METHOD OF FABRICATING SEMICONDUCTOR DEVICE

[75] Inventor: Shinichi Kawai, Kawasaki, Japan

[73] Assignee: Fujitsu Limited, Kawasaki, Japan

[21] Appl. No.: 889,953

[22] Filed: May 29, 1992

[30] Foreign Application Priority Data

May 31, 1991 [JP] Japan .................. 3-129492

[51] Int. Cl.$^5$ ............................ H01L 21/76
[52] U.S. Cl. ............................ 437/62; 437/228; 437/924
[58] Field of Search .......... 437/62, 228, 924, 974, 437/226, 227; 148/DIG. 12; 257/797

[56] References Cited

U.S. PATENT DOCUMENTS

| | | |
|---|---|---|
| 3,575,740 | 4/1971 | Castrucci et al. |
| 4,309,813 | 1/1982 | Hull. |
| 4,981,529 | 1/1991 | Tsujita .................. 437/924 |
| 5,252,510 | 10/1993 | Lee et al. .............. 437/924 |

FOREIGN PATENT DOCUMENTS

| | | |
|---|---|---|
| 55-158633 | 12/1980 | Japan . |
| 58-106826 | 6/1983 | Japan . |
| 58-158941 | 9/1983 | Japan . |
| 59-90920 | 5/1984 | Japan . |
| 61-104637 | 5/1986 | Japan . |
| 63-155613 | 6/1988 | Japan . |
| 63-187629 | 8/1988 | Japan . |
| 2060252 | 4/1981 | United Kingdom . |

OTHER PUBLICATIONS

IBM Tech. Disc. Bulletin vol. 32, No. 10B, Mar. 1990 Method of Simultaneously Defining Alignment Marks and Implantation Regions.

Primary Examiner—George Fourson
Attorney, Agent, or Firm—Staas & Halsey

[57] ABSTRACT

A method of fabricating a semiconductor device includes the steps of forming a semiconductor layer having a convex device area and a convex alignment mark on an insulating layer. The insulating layer around the alignment mark is etched using the alignment mark as a mask to thereby form a groove around the alignment mark. A mask pattern is aligned with the device using the alignment mark surrounded by the groove as a reference point. Consequently the alignment mark can be detected using the step contour provided by the groove. This makes alignment using the so-called direct alignment technique possible, and alignment precision is improved.

19 Claims, 14 Drawing Sheets

METHOD OF FABRICATING SEMICONDUCTOR DEVICE

BACKGROUND OF THE INVENTION

The present invention relates to a method of fabricating a semiconductor device, and particularly to a mask pattern aligning technique for aligning a mask pattern using an alignment mark of a thin semiconductor layer as a reference point.

Recently semiconductor devices have become increasingly more integrated and microminiaturized, and mask pattern alignment has required highly developed techniques.

In the mask pattern aligning technique for a semiconductor device having a MOSFET, the mask pattern alignment for forming the gate electrode of the MOSFET in its device area is very critical. This point will be explained with reference to FIGS. 1A and 1B.

A device area on a semiconductor substrate is isolated by a thick field oxide, and a polysilicon layer is formed on the entire surface of the substrate and patterned with a mask pattern aligned with the device area to form the gate electrode. In forming a MOSFET based on 0.5 $\mu$m design rules, the width of the gate electrode is designed to be 0.5 $\mu$m, and an overlap of the gate electrode from the device area is designed to be 0.5 $\mu$m as shown in FIG. 1A. If the misalignment between the device area and the gate electrode is more than 0.5 $\mu$m, the source region and the drain region in the device area short each other out.

Accordingly the precision of the mask pattern alignment for forming the device area and the gate electrode requires an alignment precision of 0.5 $\mu$m.

In the meantime, to suppress degradation of the characteristics of a CMOSFET due to the inter-device interference caused by latchup, an SOI (Silicon On Insulator) technique for fabricating devices in small islands of silicon on an insulating substrate is noted. Even in forming the CMOSFETs on the SOI substrate, a high alignment precision as described above for aligning the mask pattern for forming the gate electrode with the device electrode is required.

With reference to FIGS. 2A to 2H, the conventional mask pattern alignment will be explained by means of the case that a MOSFET is formed on an SOI substrate prepared by the so-called bonding technique.

FIGS. 2A to 2H show sectional views at the respective steps of the conventional method of fabricating a semiconductor device. Each drawing depicts, on the left side, a device area 6 where a device is to be formed, and on the right side, an alignment mark area 7 where an alignment mark is to be formed. In each drawing, for illustrative purposes, the device area 6 is enlarged widthwise on a larger scale than the alignment mark area 7.

As shown in FIG. 2A, a first semiconductor substrate 9 is selectively etched in the device area 6 and in the alignment mark area 7 so as to form a convex portion 9a in the device area layer and a convex portion 9b in the alignment mark area.

Then, as shown in FIG. 2B, an insulating layer 11 is formed over the entire surface of the semiconductor substrate 9 including the convex portions 9a and 9b.

Next, as shown in FIG. 2C, the surface of the insulating layer 11 is polished so as to present an isolation insulating layer 11a having a flat upper surface, which is left on top of the convex portions 9a and 9b.

Then, as shown in FIG. 2D, the first semiconductor substrate 9 is turned over and is laid on a second semiconductor substrate 12 for support purposes through the isolation insulating layer 11a which is bonded to substrate 12 by applying voltage and heat.

Subsequently, as shown in FIG. 2E, the backside of the first semiconductor substrate 9 is etched or polished until the isolation semiconducting layer 11a is exposed with the originally convex portion 9a of the device area and the originally convex portion 9b of the alignment mark area embedded as islands in the isolation semiconducting layer 11a. The originally convex portions 9a and 9b are thus isolated from each other by the isolation insulating layer 11a. Thus, an SOI substrate 8 is completed.

Then, as shown in FIG. 2F, insulating layers 13a and 13b are formed respectively on the surfaces of the device area portion 9a and of the alignment mark portion 9b. The insulating layer 13a is to be the gate insulating layer for the device area 6.

Subsequently, as also shown in FIG. 2F, a polysilicon layer 14 is formed on the entire surface of the SOI substrate 8 so as to cover the insulating layers 13a and 13b. The polysilicon layer 14 is to be the gate electrode for the device area 6.

Then, as also shown in FIG. 2F, a resist layer 15 is formed on the polysilicon layer 14. A mask 16 is then aligned with the alignment mark 9b as the reference point. A mask pattern 16a on the aligned mask 16 is transferred to the resist layer 15 by photolithography. Then the resist layer 15 is developed, and resist patterns 15a and 15b are formed.

Subsequently, as shown in FIG. 2G, the polysilicon layer 14 is selectively etched using the resist patterns 15a and 15b as the masks. Thus, a gate electrode 14a is formed in the device area 6 and a polysilicon layer 14b is formed in the alignment mark area.

Then, as shown in FIG. 2H, dopant ions are implanted into the device area layer 9a using the gate electrode 14a as the mask so as to form a source region 17a and a drain region 17b. Next, an insulating layer 19 is formed in the device area so as to cover the gate electrode 14a. Then a source electrode 18a connected to the source region 17a, and a drain electrode 18b connected to the drain region 17b are formed, and a MOSFET is thus completed.

As described above, in the conventional method of fabricating the semiconductor device, when the polysilicon layer 14 is patterned to form the gate electrode 14a, following the fabrication of the SOI substrate 8, as shown in FIG. 2F, the alignment mark 9b, which has been formed at the time of the formation of the device area layer 9a, is buried in the isolation insulating layer 11a. According, the alignment mark 9b, which has no step contour and is buried under the polysilicon layer 14, cannot be detected using a conventional pattern detection method which depends on step contours.

In addition to the bonding technique, SOI substrates can be fabricated using a SIMOX (Separation by Implanted Oxygen) technique, a laser recrystallization technique for recrystallizing a polysilicon layer by a laser beam, and other techniques. When a semiconductor device is fabricated on an SOI substrate fabricated by a technique other than a bonding technique, it is also a problem that the contrast due to a reflectance difference cannot be easily directed when both the semiconductor layer on the isolation insulating layer and the alignment mark are very thin in accordance with the recent higher integration and microminiaturization of semiconductor devices.

SUMMARY OF THE INVENTION

An object of the present invention is to provide a method of fabricating a semiconductor device employing an alignment mark which enables alignment by the so-called direct alignment technique in which an alignment mark formed in an immediately preceding processing step is usable in an aligning operation.

The above-described objects are achieved by a method of fabricating a semiconductor device comprising the steps of forming a semiconductor layer having a convex device area and a convex alignment mark on an insulating layer, selectively etching the insulating layer around the alignment mark using the alignment mark as a mask so as to form a groove around the alignment mark, and aligning a mask pattern with the device using the alignment mark surrounded by the groove as a reference point.

Further, the above-described objects are achieved by a method of fabricating a semiconductor device comprising the steps of etching a first semiconductor substrate so as to form a convex device area portion and a convex alignment mark portion, forming an insulating layer on the entire surface so as to cover the convex portions, polishing or etching the insulating layer to flatten the surface of the insulating layer, bonding a second semiconductor substrate to the flat surface of the insulating layer, polishing or etching the backside of the first semiconductor substrate to leave the convex portions forming the device area and the alignment mark embedded as islands in the insulating layer, selectively etching the insulating layer around the alignment mark portion using the alignment mark as a mask to form a groove around the alignment mark portion, and aligning a mask pattern with the substrate using the alignment mark portion surrounded by the groove as a reference point.

Furthermore, the above-described objects are achieved by a method of fabricating a semiconductor device comprising the steps of forming anti-oxidation layers on a first semiconductor substrate so as to cover a first area where a device is to be formed and a second area where an alignment mark is to be formed, selectively oxidizing the first semiconductor substrate using the anti-oxidation layers as masks to form a field oxide layer around the first and the second areas, forming an insulating layer on the entire surface so as to cover the first and the second areas, polishing or etching the insulating layer to flatten the surface of the insulating layer, bonding a second semiconductor substrate to the flat surface of the insulating layer, polishing or etching the backside of the first semiconductor substrate to leave the device area and the alignment mark embedded as islands in the field oxide layer, selectively etching the field oxide layer around the alignment mark using the alignment mark as a mask to form a groove around the alignment mark, and aligning a mask pattern substrate using the alignment mark surrounded by the groove as a reference point.

According to the present invention, an insulating layer around the alignment mark may be selectively etched using the alignment mark as the mask to form a groove around the alignment mark. Consequently the alignment mark may be detected using the using the step contour presented by the groove. This enables alignment using the so-called direct alignment technique and improves alignment precision.

Further, according to the present invention, even in a case when the surface of an SOI substrate is flat and an alignment mark is embedded in an insulating layer, the insulating layer around the alignment mark may be selectively etched to form a groove around the alignment mark. As a result the alignment mark may be detected using the a step contour presented by the groove. This enables alignment using the so-called direct technique and improves alignment precision.

Furthermore, according to the present invention, even in a case where the semiconductor layer of an SOI substrate fabricated using a SIMOX technique is so thin that it is difficult to detect an alignment mark, an insulating layer around the alignment mark may be selectively etched using the alignment mark as the mark to form a groove around the mark. Consequently, the alignment mark may be detected using the step contour presented by the groove around the alignment mark. As a result, alignment using the so-called direct alignment technique is made possible, and alignment precision is improved.

DETAILED DESCRIPTION OF THE INVENTION

Figure 1A:
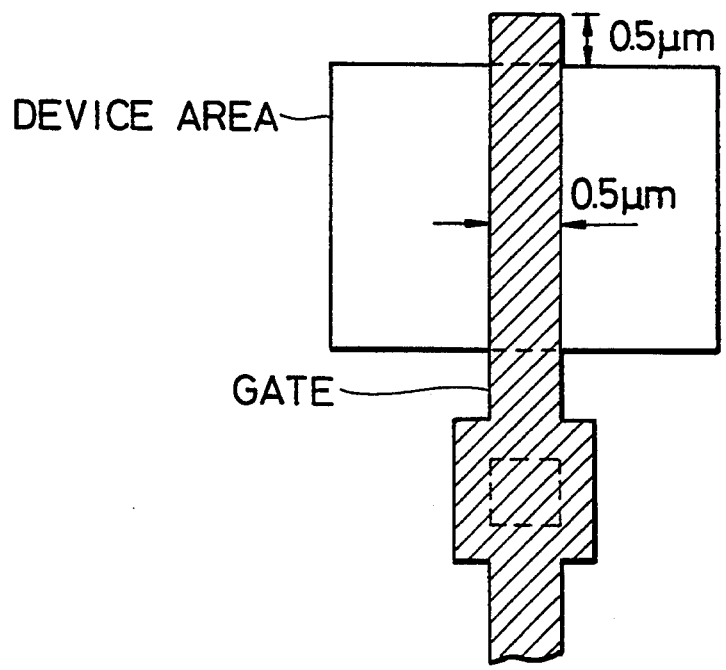
FIGS. 1A and 1B are views explaining tolerances involved in the layout of a MOSFET.
Figure 1B:
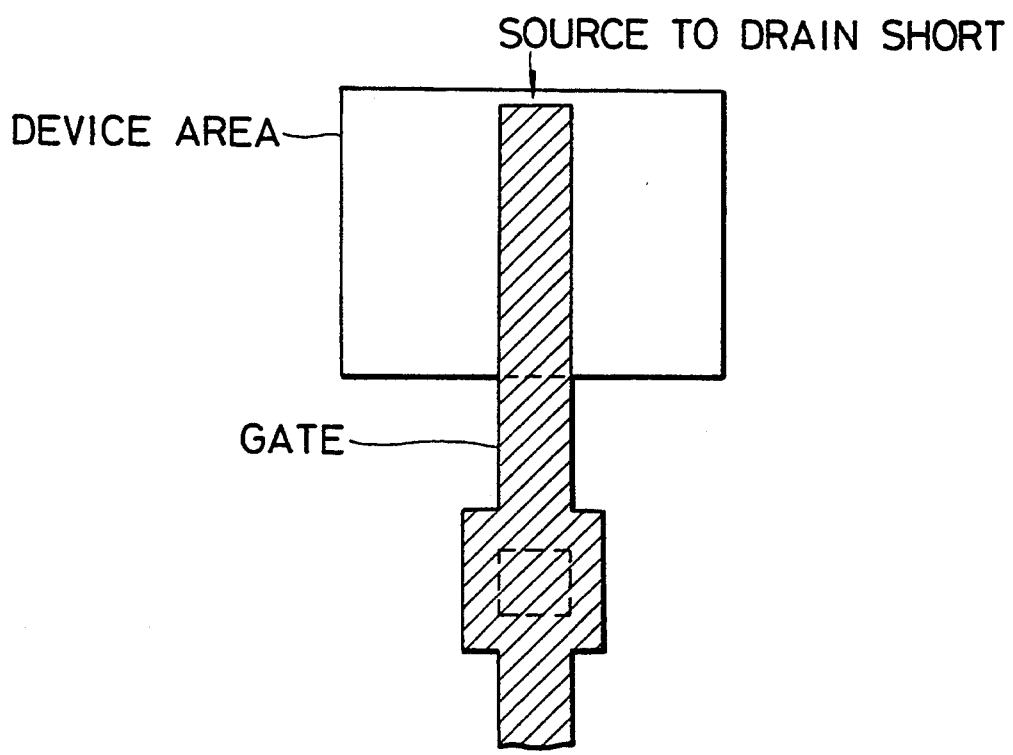
Figure 2A:
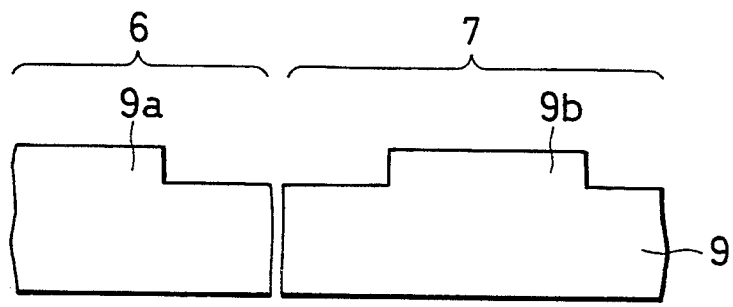
FIGS. 2A to 2H are sectional views for explaining at the respective steps involved in a conventional method for fabricating a semiconductor device.
Figure 2B:
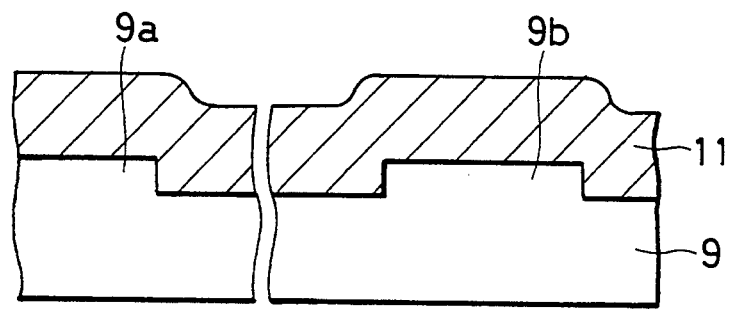
Figure 2C:
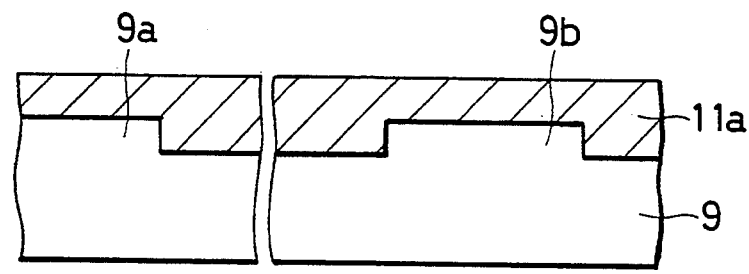
Figure 2D:
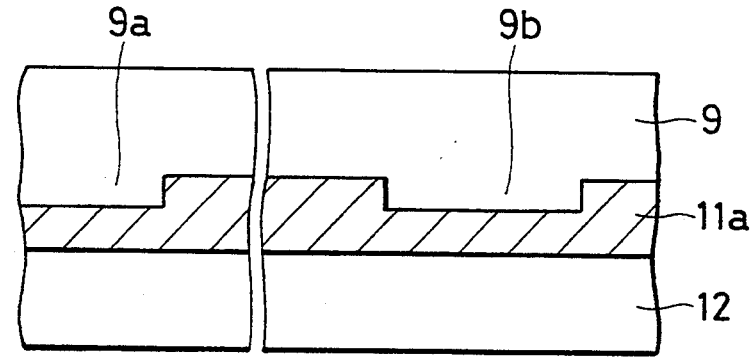
Figure 2E:
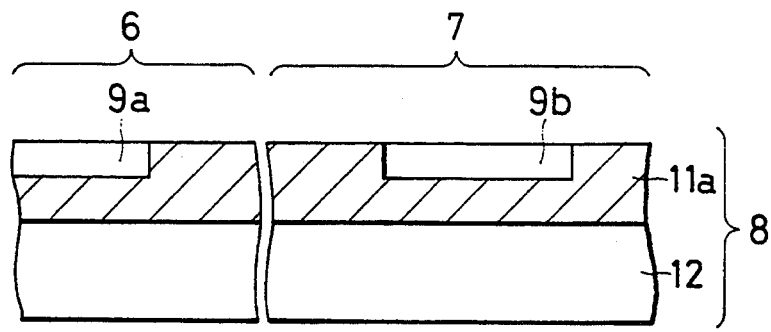
Figure 2F:
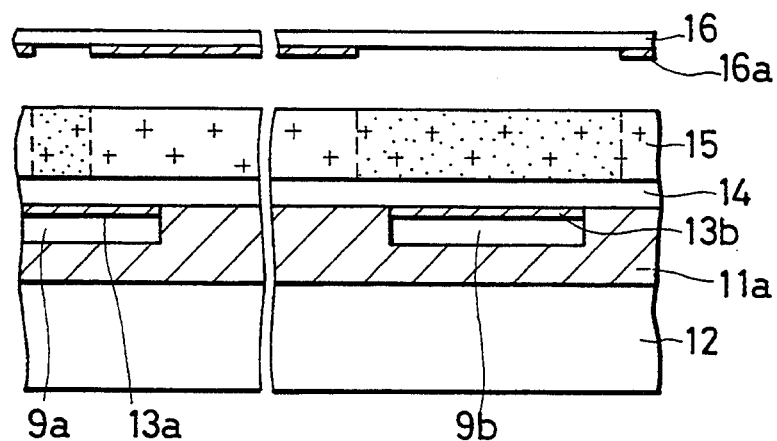
Figure 2G:
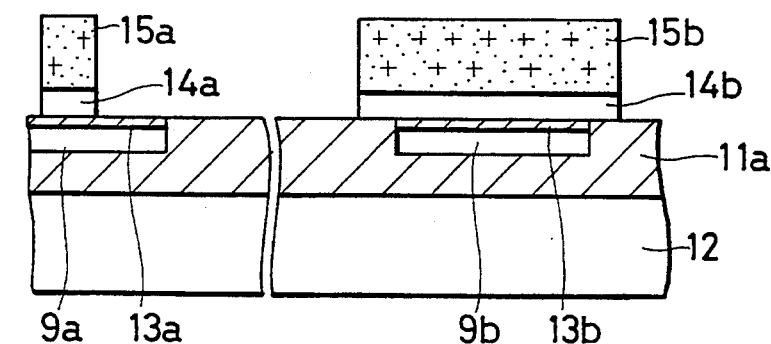
Figure 2H:
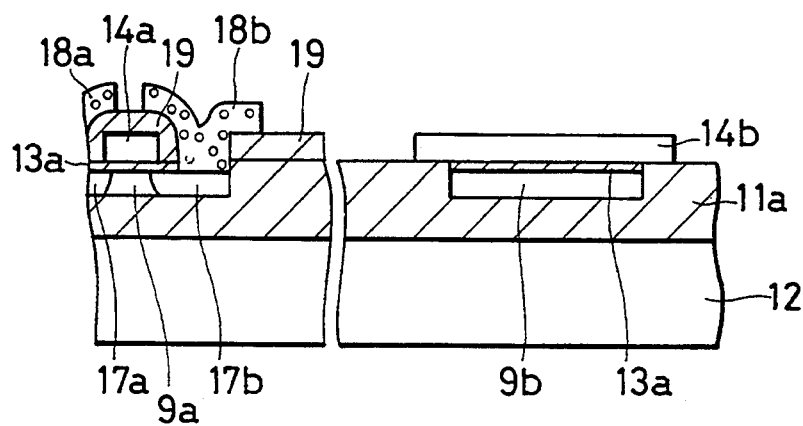

The method of fabricating a semiconductor device according to a first embodiment of the present invention is explained with reference to FIGS. 3A to 3I, and FIGS. 4A and 4B. FIG. 4A is a general plan view of a semiconductor wafer. FIG. 4B is an enlarged view of the boundary portion of the wafer of FIG. 4A located between a device area 22 and an alignment mark area 26. FIGS. 3A to 3I are sectional views taken along the line B—B of FIG. 4B at respective steps during the fabrication of a semiconductor device.

In FIGS. 3A to 3I, and FIG. 4B, a device area 22 where a device is to be formed is shown at the left, and an alignment mark area 26 where an alignment mark is to be formed is shown at the right. In the respective drawings, for illustrative purposes, the alignment mark area 26 is shown on a larger scale widthwise than the device area 22.

The semiconductor device to be fabricated by the method according to this embodiment of the invention is fabricated in each of a number of device areas 22 divided on an SOI substrate 20 by scribe line areas 24 as shown in FIG. 4A. As shown in FIG. 4B, in the parts of the scribe line areas adjacent to each device area 22 there is provided an alignment mark area 26 where an alignment mark is to be formed.

Figure 3A:
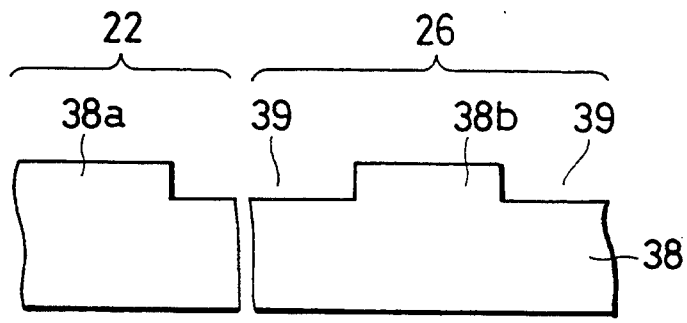
FIGS. 3A to 3I are sectional views for explaining the respective steps involved in the method for fabricating a semiconductor device according to a first embodiment of the present invention.
Figure 4A:
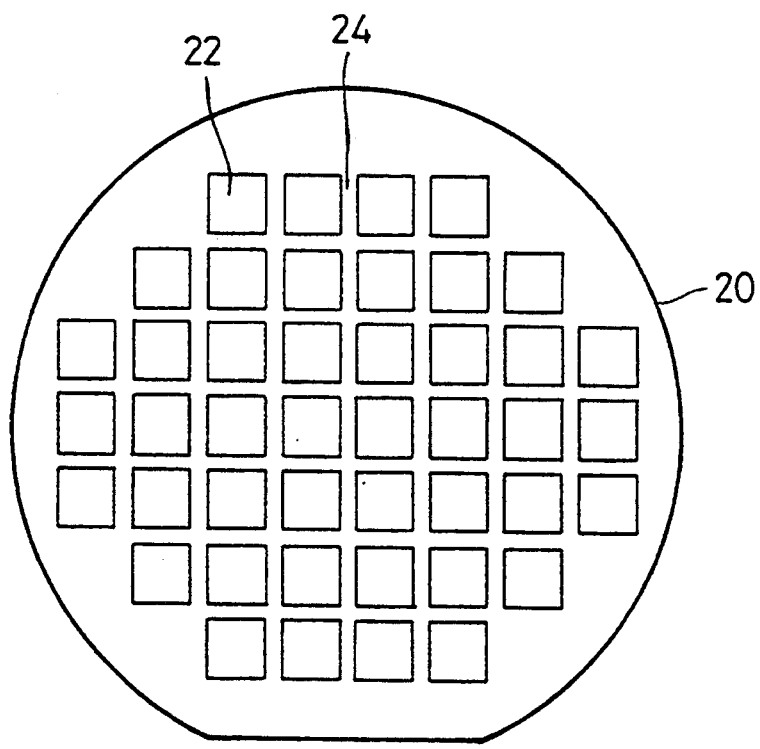
FIG. 4A is a general plan view of a semiconductor wafer.
Figure 4B:
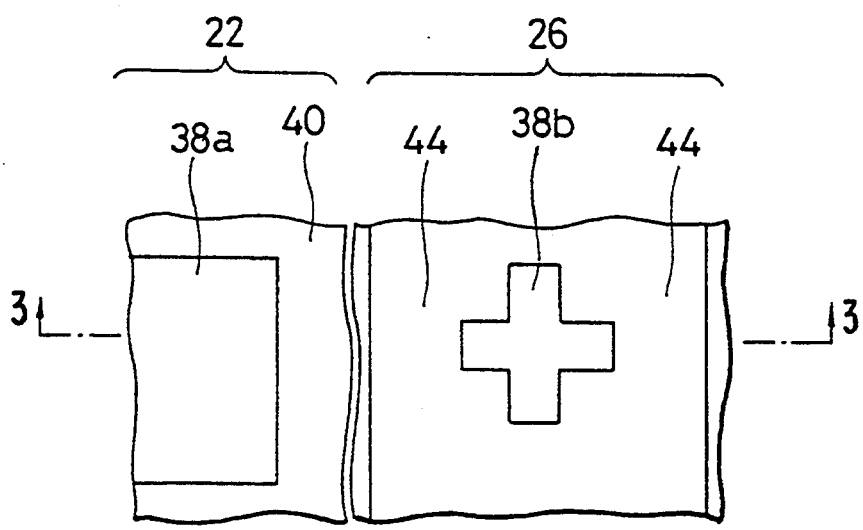
FIG. 4B is an enlarged plan view of a boundary portion of the wafer of FIG. 4A located between a device area and an alignment mark area.

First, as shown in FIG. 3A, a first silicon substrate 38 is selectively etched using a resist layer (not shown) as the mask by RIE (Reactive Ion Etching) using a mixed gas of $BCl_3$ and $Cl_2$ so as to form grooves having a depth of about 0.1 μm presenting square convex portions 38a where device areas are to be formed and cross-shaped convex portions 38b to be used as alignment marks.

As shown in FIG. 4B, each convex portion 38a where a device area is to be formed has a square shape which has a dimension of about 3 μm on each side. Each convex alignment mark portion 38b has a cross-shape having four arms which are each about 10 μm in width and about 10 μm in length.

Figure 3B:
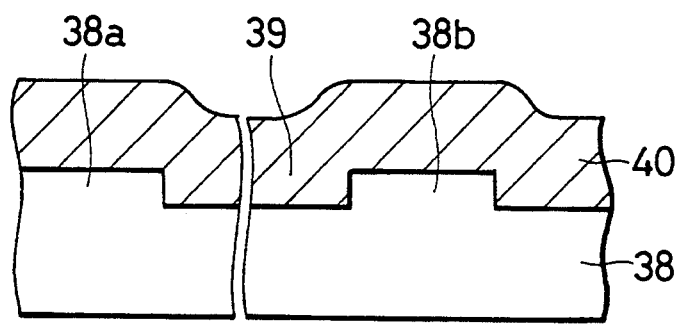

Then, as shown in FIG. 3B, a silicon oxide layer 40 is deposited on the first silicon substrate 38 to a thickness of about 1 μm by CVD, thus burying the groove 39, the convex device area portion 38a and the convex alignment mark portion 38b.

Figure 3C:
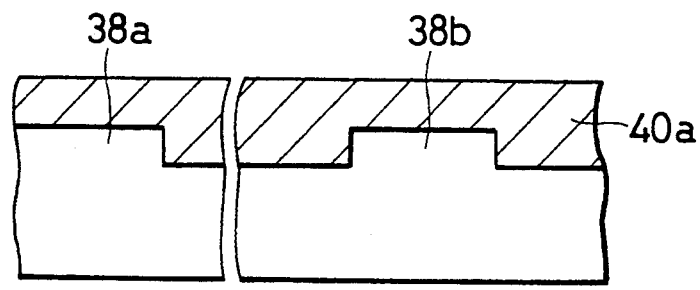

Next, as shown in FIG. 3C, the surface of the silicon oxide layer 40 is polished to present a silicon oxide layer 40a, which is left on the convex portions 38a and 38b as an isolation insulating layer of a required thickness.

In FIGS. 3B and 3C, a polysilicon layer (not shown) may be formed on the silicon oxide layer 40 to a thickness of about 0.2 μm by low pressure CVD, and thereafter the polysilicon layer may be polished or etched to flatten the surface of the polysilicon layer. This makes it possible to improve the flatness of the surface of the first silicon substrate 38.

Figure 3D:
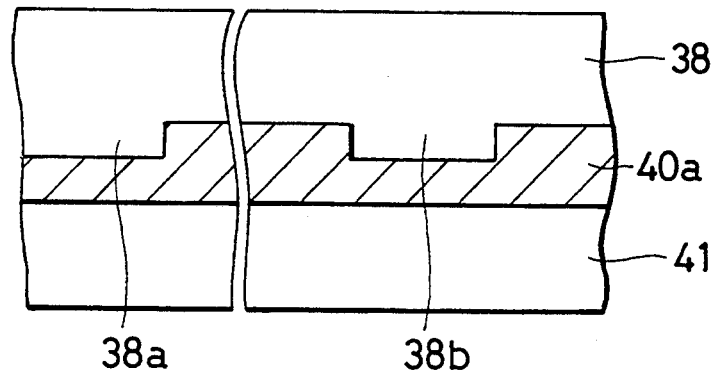

Then, as shown in FIG. 3D, the first silicon substrate 38 and a second silicon substrate 41 are laid on each other with the silicon oxide layer 40a sandwiched therebetween, and a pulse voltage is applied between the first silicon substrate 38 and the second silicon substrate 41. The first silicon substrate 38 and the second silicon substrate 41 are thus bonded to the oxide layer 40a.

Figure 3E:
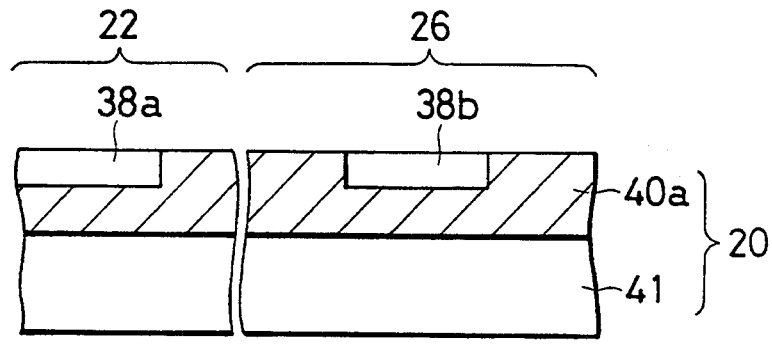

Next, a shown in FIG. 3E, the backside of the bonded first silicon substrate 38 is polished down until the silicon oxide layer 40a is exposed with the first silicon substrate 38 left as the convex portions 38a and 38b which are embedded in the silicon oxide layer 40a. An SOI substrate 20 having the device area layer 38a and the alignment mark 38b embedded as islands in the surface of the silicon oxide layer 40 formed on the second silicon substrate 41 is thus fabricated.

Figure 3F:
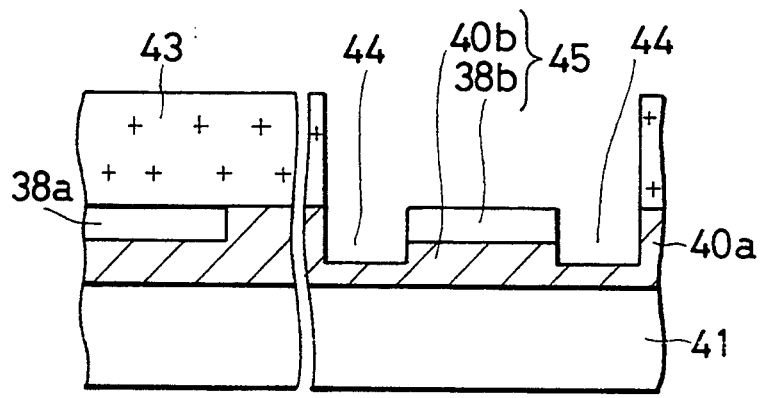

Then, as shown in FIG. 3F, a resist layer 43 is formed on the entire surface, and the resist layer 43 is patterned by photolithography so as to selectively remove that part of the resist layer 43 in an area about 50 μm in width which includes the cross-shaped alignment mark 38b.

Subsequently, that part of the silicon oxide layer 40a around the alignment mark 38b is selectively etched by RIE (Reactive Ion Etching) using a mixed gas containing $CF_4$ and $CHF_3$ at a ratio of 1:1, an etching gas pressure of about 1.8 Torr and an etching power of 300 W and using the patterned resist layer 43 and the alignment mark 38b as the mask. A groove 44 having a depth of 0.5 μm is formed around the alignment mark 38b. Thus, the alignment mark 38b and the silicon oxide layer 40b present a convex portion 45. The convex portion 45 has the same plane shape as the alignment mark 38b and provides a step contour necessary for the alignment of a mask 48.

In FIG. 3F, the groove 44 was formed by selective etching of the silicon oxide layer 40a around the alignment mark 38b by RIE. However, the groove 44 may also be formed by wet etching. In the wet etching procedure the silicon oxide layer 40a is etched with an etchant containing a 10:100 mixture of HF and $H_2O$. When such as wet etching procedure is used, thinning of the alignment mark 38b is prevented because the etching ratio between silicon of the alignment mark 38b and the silicon oxide of the layer 40a is very high.

Figure 3G:
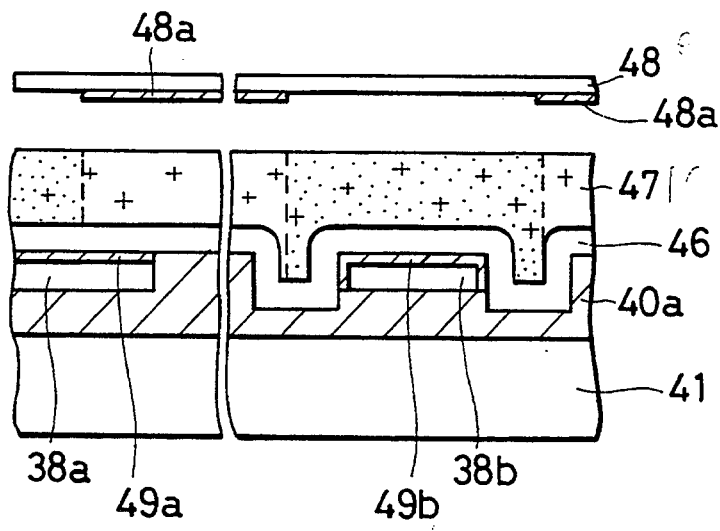

Subsequently, as shown in FIG. 3G, following the removal of the residual resist layer 43, a thin silicon oxide gate insulating layer 49a is formed on the device area layer 38a by thermal oxidation. A thin silicon oxide layer 49b is formed also on the top and the sides of the alignment mark 38b.

Subsequently a polysilicon layer 46 having a thickness of about 0.3 μm is formed on the entire surface, and then a resist layer 47 is formed on the silicon layer 46. Then a mask pattern 48a on an exposure mask 48 is aligned with the device. Subsequently the mask pattern 48a of the exposure mask 48 is transferred to the resist layer 47.

Figure 3H:
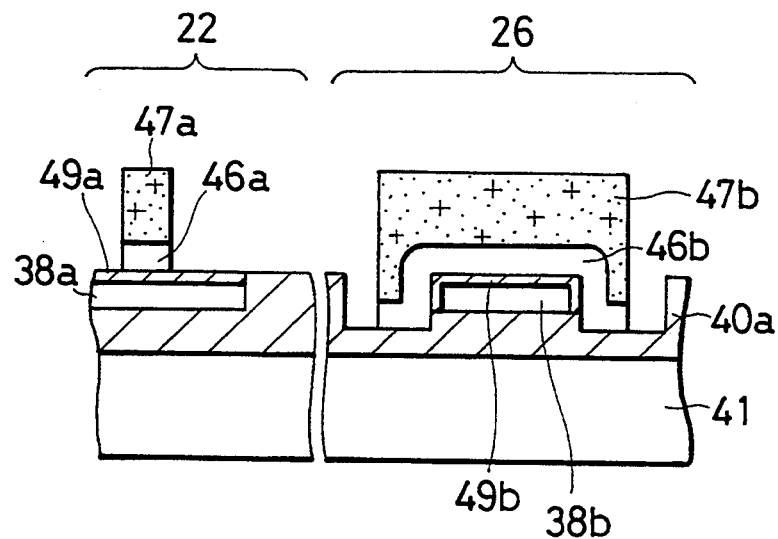

Next, as shown in FIG. 3H, following the development of the resist layer 47, the polysilicon layer 46 is selectively etched using the residual resist layers 47a and 47b as the mask. A gate electrode 46a is thus formed on the gate insulating layer 49a on the device area layer 38a, and at the same time a polysilicon layer 46b has been formed on the alignment mask 38b.

Figure 3I:
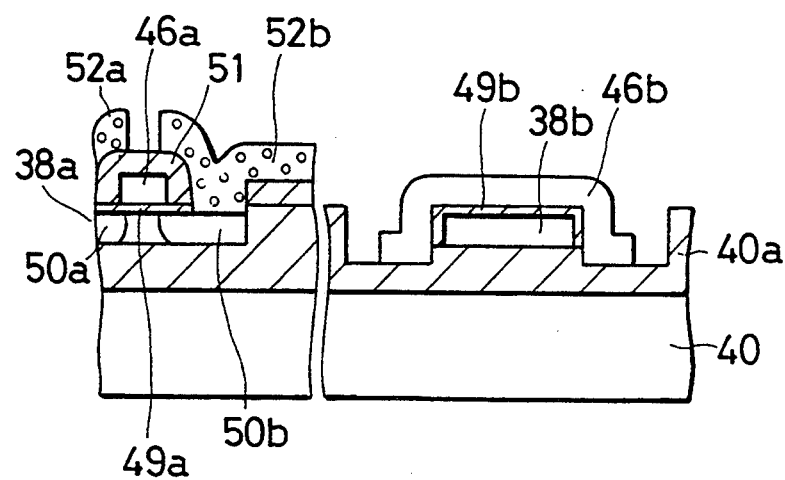

Then, as shown in FIG. 3I, dopant ions are implanted in the device area layer 38a using the gate electrode 46a as the mask to thereby form a source region 50a and a drain region 50b. An insulating layer 51 is formed so as to cover the gate electrode 46a. Next, a source electrode 52a connected to the source region 50a, and a drain electrode 52b connected to the drain region 50b are formed. And a MOSFET is completed.

As described above, according to the method of fabricating the semiconductor device according to the first embodiment of the present invention, in a case where the surface of an SOI substrate 20 formed by the bonding technique is flat, and the alignment mark 38b is embedded in the insulating layer 40a, the insulating layer 40a is selectively etched using the alignment mark 38b as the mask so as to form the groove 44 around the alignment mark 38b. Consequently the alignment mark 38b can be detected using the step contour presented by the groove 44. Alignment by the so-called direct alignment technique is thus possible, and alignment precision is improved.

The method of fabricating a semiconductor device according to a second embodiment of the present invention is explained with reference to FIGS. 5A to 5J. An SOI substrate 20 used in this embodiment is fabricated using the same bonding technique as is used in the first embodiment. The fabrication method according to this embodiment differs from the first embodiment in the method used for forming the device area layer and the alignment mark.

FIGS. 5A to 5J are sectional views taken along the line B—B of FIG. 4B at respective steps during the fabrication of the semiconductor device according to this embodiment. In FIGS. 5A to 5J, components common with the first embodiment have reference numerals common with those of the first embodiment, and explanation of such components is omitted or otherwise summarized.

First, a silicon nitride layer 60, which is an anti-oxidation layer, is formed on the entire surface of a first silicon substrate 38. Subsequently this silicon nitride layer 60 is patterned to form a silicon nitride layer 60a in an area 22 where a device is to be formed, and a silicon nitride layer 60b is formed in an alignment mark area 26 where an alignment mark is to be formed.

Figure 5A:
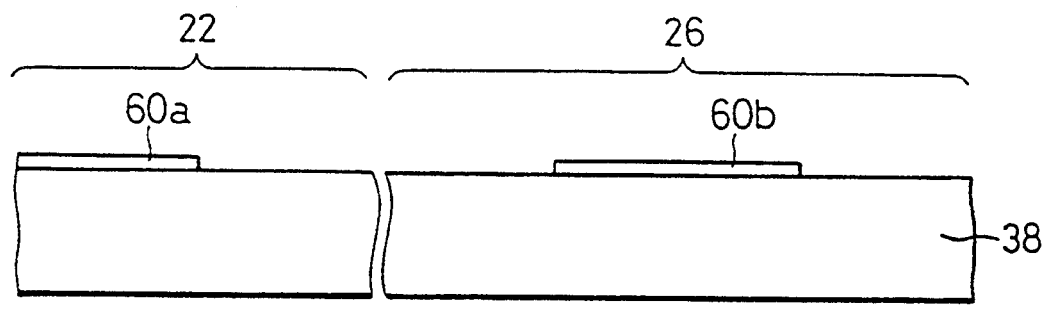
FIGS. 5A to 5J are sectional views for explaining the respective steps involved in the method for fabricating a semiconductor device according to a second embodiment of the present invention.
Figure 5B:
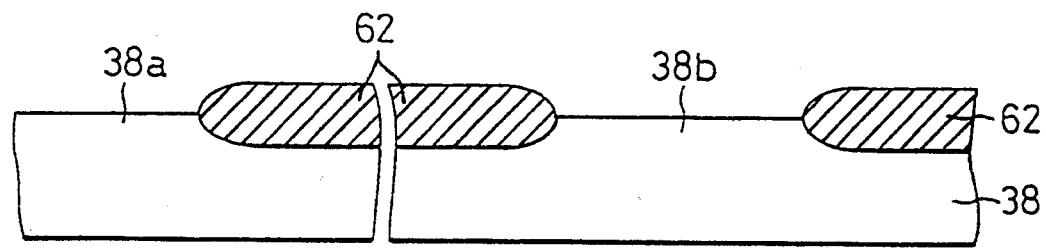

Then, a field oxide layer 62 is formed by a LOCOS (Local Oxidation of Silicon) technique, and then the silicon nitride layers 60a and 60b are removed. As shown in FIG. 5B, as a result of these steps, a convex device area portion 38a and a convex alignment mark portion 38b are formed on the first silicon substrate 38.

As shown in FIG. 5B, the convex portion 38a is shaped as a square having a dimension of about 3 μm on each side, and the convex alignment mark portion 38b is in the shape of a cross having four arms which are each about 10 μm in width and about 10 μm in length.

Figure 5C:
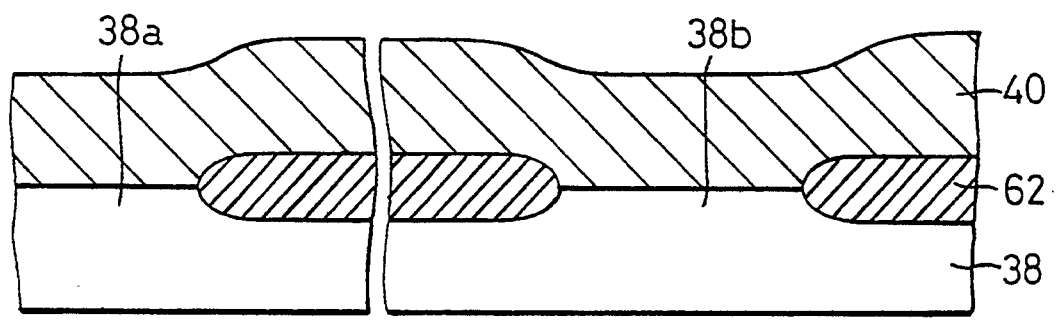

Next, as shown in FIG. 5C, a silicon oxide layer 40 having a thickness of about 1 μm is formed on the first silicon substrate 38 by CVD so as to cover the convex device area portion 38a and the convex alignment mark portion 38b.

Figure 5D:
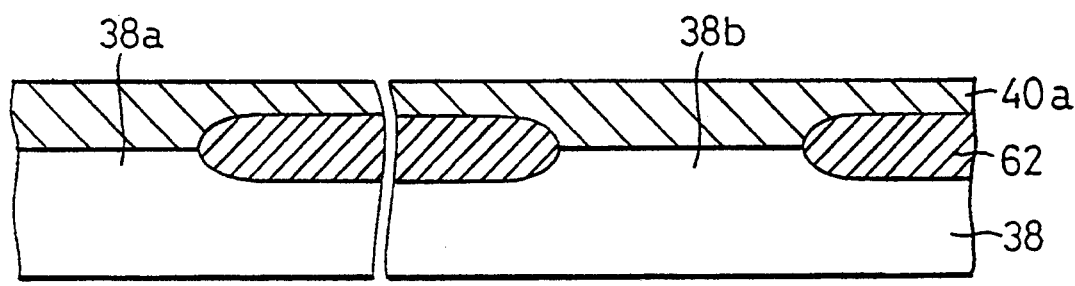

Subsequently, as shown in FIG. 5D, the surface of the silicon oxide layer 40 is polished to present a flat silicon oxide layer 40a which is left on top of the convex portions 38a and 38b as an isolation insulating layer of a required thickness.

In FIGS. 5C and 5D, a polysilicon layer (not shown) may be formed on the silicon oxide layer 40 to a thickness of about 0.2 μm by low pressure CVD, and thereafter, the polysilicon layer may be polished or etched to flatten the surface of the polysilicon layer. This makes it possible to improve the flatness of the surface of the first silicon substrate 38.

Figure 5E:
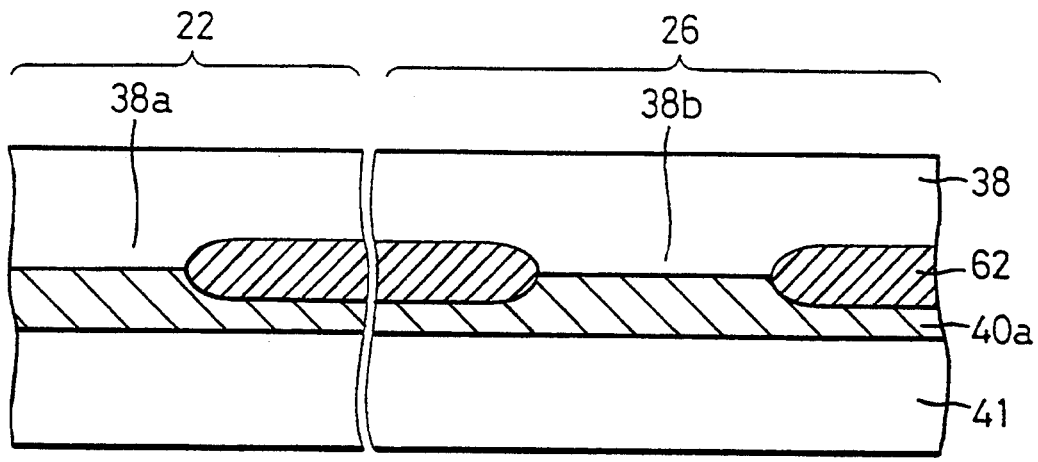

Then, as shown in FIG. 5E, the first silicon substrate 38 is bonded to a second silicon substrate 41 with the silicon oxide layer 40a sandwiched therebetween.

Figure 5F:
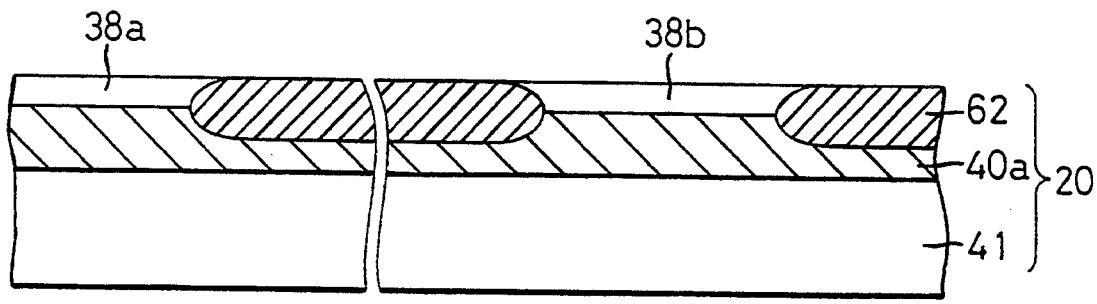

Subsequently, as shown in FIG. 5F, the backside of the bonded first silicon substrate 38 is polished until the field oxide layer 62 is exposed with the first silicon substrate 38 embedded in the field oxide layer 62 as convex portions 38a and 38b. Thus formed is an SOI substrate 20 where the device area layer 38a and the alignment mark 38b are embedded as islands in the silicon oxide layer 40a and the field oxide layer 62 formed on the second silicon substrate 41.

Figure 5G:
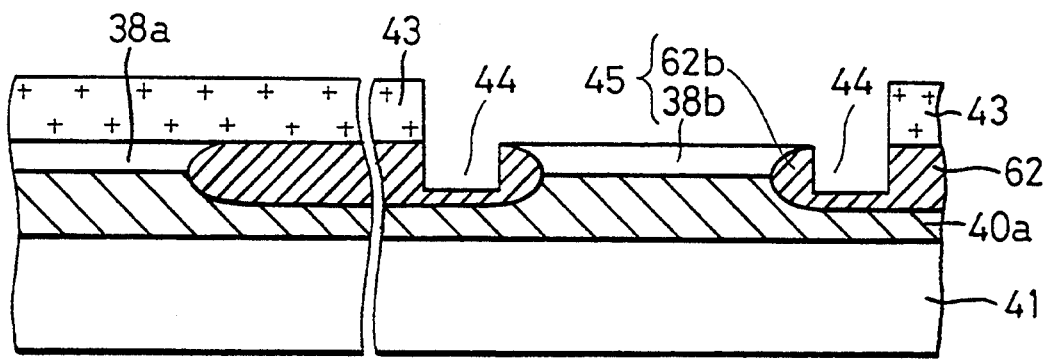

Then, as shown in FIG. 5G, a resist layer 43 is formed on the entire surface, and the resist layer 43 is patterned by lithography to remove that part of the resist layer 43 in an area about 50 μm wide which includes the cross-shaped alignment mark.

Subsequently, that part of the field oxide layer 62 around the alignment mark 38b is selectively etched by RIE using a mixture of $CF_4$ and $CHF_3$ as the etchant gas using the patterned resist layer 43 and the alignment mark 38b as the mask. An groove 44 about 0.5 μm deep is formed around the alignment mark 38b as shown in FIG. 5G. As a result, a convex portion 45 constituted by the alignment mark 38b and the field oxide layer 62 is formed. The convex portion 45 has the same plane shape as the alignment mark 38b and has a step contour as is necessary for the alignment of the mask 48.

In FIG. 5F, the field oxide layer 62 may be etched by wet etching in place of RIE, using a mixed liquid of HF and $H_2O$.

Figure 5H:
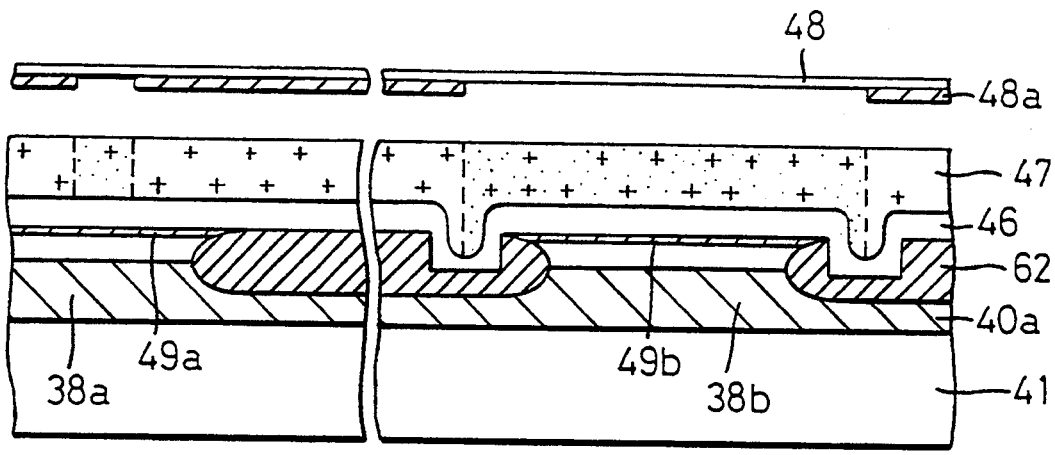

Then, as shown in FIG. 5H, following the removal of the residual resist layer 43, a thin silicon oxide gate insulating layer 49a is formed on the device area layer 38a by thermal oxidation. A thin silicon oxide layer 49b is also formed on the top and the sides of the alignment mark 38b.

Subsequently, a polysilicon layer 46 is formed on the entire surface, and then a resist layer 47 is formed on the polysilicon layer 46. Next, a mask pattern 48a on an exposure mask 48 is aligned using the alignment mark 38b as the reference point. At this time, the alignment by the so-called direct alignment technique can be conducted using the alignment mark 38b as the reference point, which reference point has been formed concurrently with the device area layer 38b, since the alignment mark 38b has a step contour necessary for the alignment. As a result, the precision of the alignment is improved. The mask pattern 48a of the exposure mask 48 is then transferred to the resist layer 47.

Figure 5I:
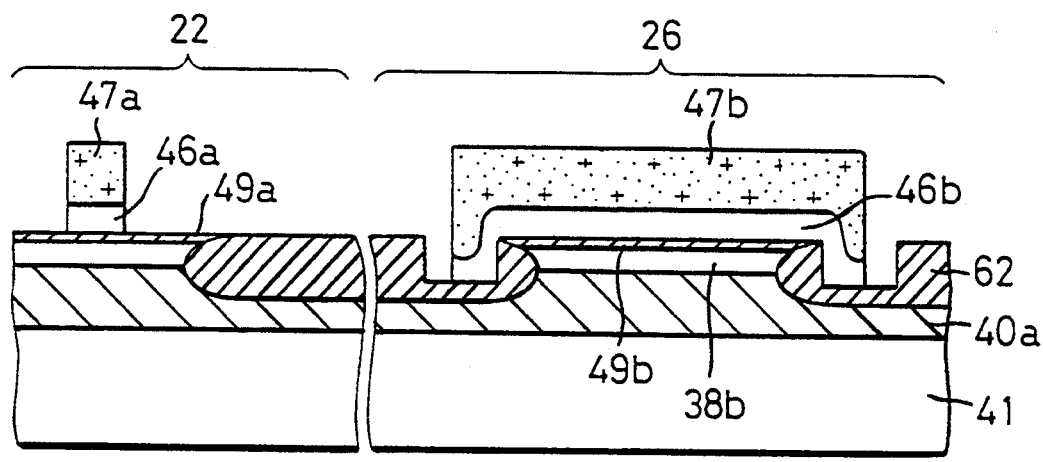

Next, as shown in FIG. 5I, after the resist layer 47 is developed, the polysilicon layer 46 is selectively etched using the residual resist layers 47a and 47b as the mask to form a gate electrode 46a on the gate insulating layer 49a on the device area layer 38a. At the same time, a polysilicon layer 46b is also formed in the area including the alignment mark 38b.

Figure 5J:
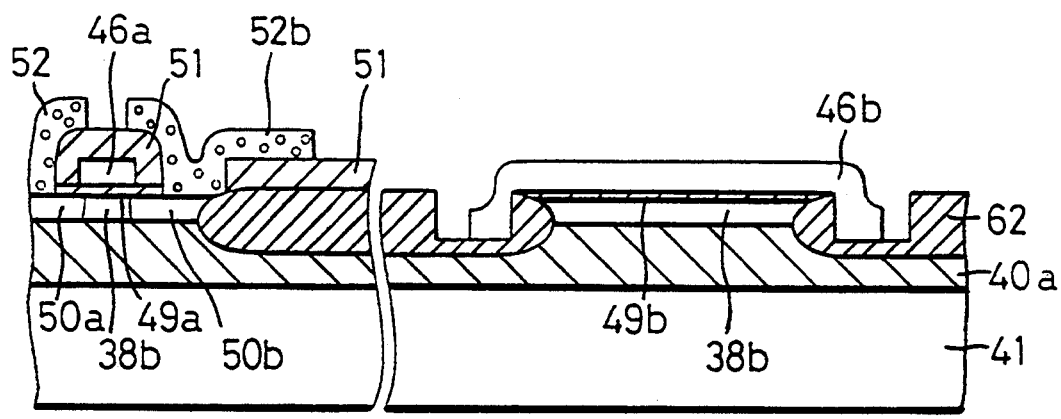

Then, as shown in FIG. 5J, dopant ions are implanted in the device area layer 38a using the gate electrode 46a as the mask to form a source region 50a and a drain region 50b. Then an insulating layer 51 is formed so as to cover the gate electrode 46a. Subsequently a source electrode 52a connected to the source region 50a, and a drain electrode 52b connected to the drain region 50b are formed. And a MOSFET is completed.

As describe above, according to the second embodiment of the method of fabricating the semiconductor device of the present invention, even in a case when the device area layer 38a and the alignment mark 38b are embedded as islands in the field oxide layer 62 formed by LOCOS, that part of the field oxide layer 62 around the alignment mark 38b is selectively etched using the alignment mark 38b as the first to form the groove 44 around the alignment mark 38b. As a result the alignment mark 38b can be detected using the step contour presented by the alignment mark 38b with respect to the groove 44. This makes alignment by the so-called direct alignment technique possible, and improves alignment precision.

The method of fabricating a semiconductor device according to a third embodiment of the present invention is explained with reference to FIGS. 6A to 6G are sectional views taken along the line B—B in FIG. 4B at respective steps during the fabrication of a semiconductor device according to the third embodiment of the present invention.

This embodiment differs from the first and the second embodiments in that in the first and the second embodiments the SOI substrate 20 is fabricated using bonding technique. In the present embodiment, however, an SOI substrate is fabricated using a laser recrystallization technique.

Figure 6A:
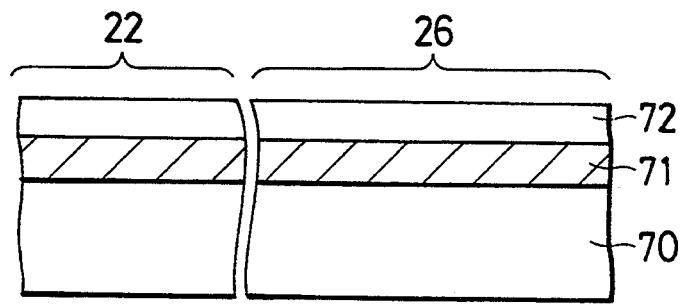
FIGS. 6A to 6G are sectional views for explaining the respective steps involved in the method for fabricating a semiconductor device according to a third embodiment of the present invention.

First, as shown in FIG. 6A, silicon oxide layer 71 having a thickness of about 0.7 μm is formed on a silicon substrate 70, and a polysilicon layer 72 having a thickness of about 0.1 μm is formed thereon.

Figure 6B:
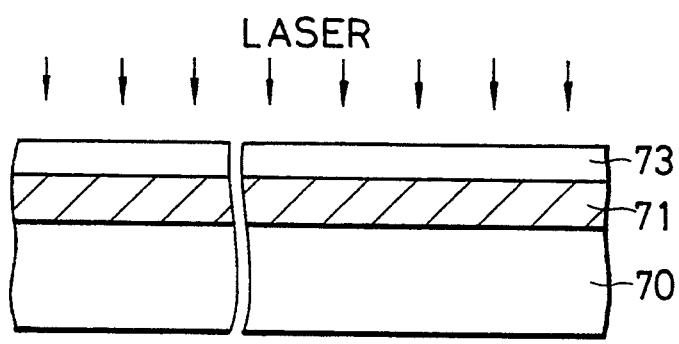

As shown in FIG. 6B, the polysilicon layer 72 is melted by a laser beam so as to recrystallize into a monocrystal silicon layer 73. The SOI substrate 20 so formed has a monocrystal silicon layer 73 formed on the silicon oxide layer 71.

The SOI substrate 20 may be formed by SIMOX (Separation by IMplanted Oxygen) technique in place of the technique as shown in FIGS. 6A and 6B.

Figure 6C:
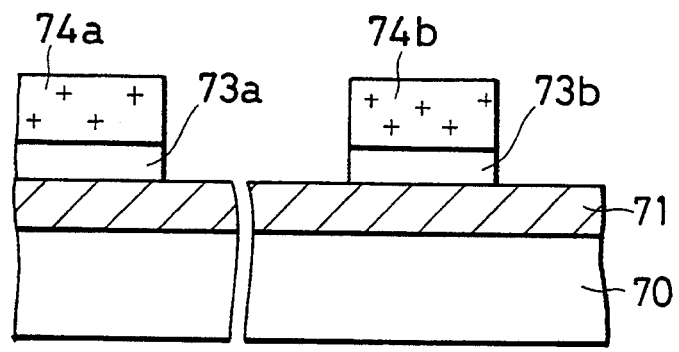

Subsequently a resist layer 74 is formed on the entire surface of the silicon layer 73. Then as shown in FIG. 6C, the resist layer 74 is patterned to form a resist layer 74a disposed over a device area, and a resist layer 74 and 74b as the mask to form a device area layer 73a in the device area 22, and an alignment mark 73b in the alignment mark area 26. Then the resist layers 74a and 74b are removed.

Figure 6D:
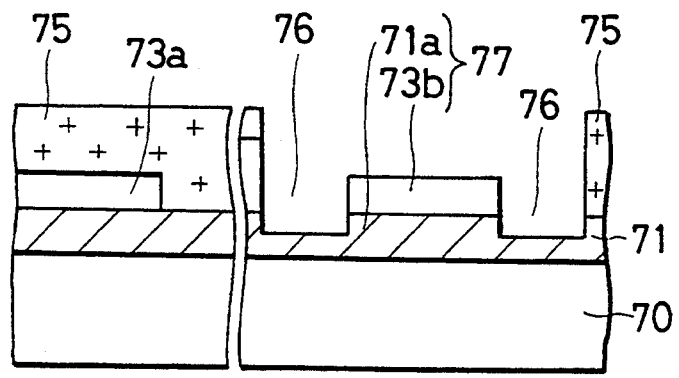

As shown in FIG. 6D, a resist layer 75 is formed on the entire surface, and then the resist layer 75 is patterned by photolithography to selectively remove that part of the resist layer 75 in an area about 50 μm wide which includes the cross-shaped alignment mark 73b.

That part of the silicon oxide layer 71 around the alignment mark 73b is selectively etched by RIE using a mixture of $CF_4$ and $CHF_3$ as an etchant gas and using the patterned resist layer 75 and the alignment mark 73b as the mask. As a result, a groove 76 having a depth of about 0.5 μm is formed around the alignment mark 73b. A convex portion 77 constituted by the alignment mark 73b and the silicon oxide layer 71a is thus formed. The convex portion 77 has the same plane shape as the alignment mark 73b and provides a step contour necessary for the alignment.

Alternatively in FIG. 6D, that part of the silicon oxide layer 71 around the alignment mark 73b may be selectively etched by wet etching using a mixture of HF and $H_2O$ as an etchant in place of RIE. After etching, the residual resist layer 75 is removed.

Figure 6E:
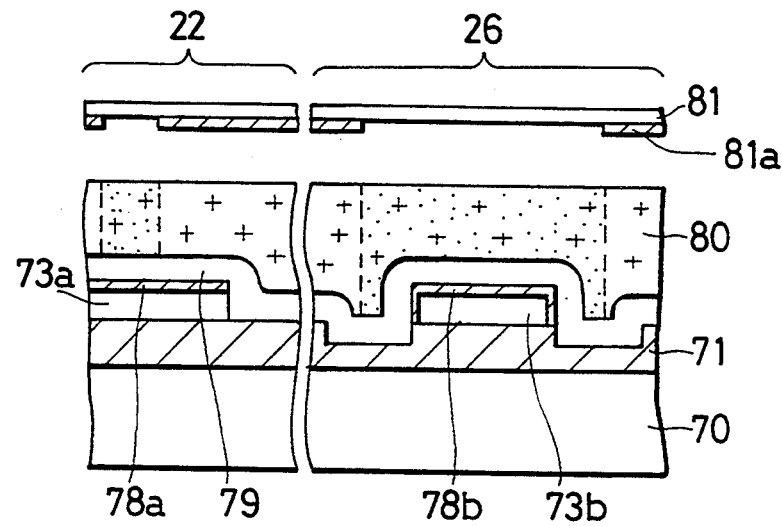

Subsequently, as shown in FIG. 6E, a thin gate insulating silicon oxide layer 78a is formed on the device area layer 73a by thermal oxidation. A thin silicon oxide layer 78b is formed also on the top and the sides of the alignment mark 73b.

Then a polysilicon layer 79 which is about 0.3 μm thick is formed on the entire surface, and then a resist layer 80 is formed on the polysilicon layer 79. Next, a mask pattern 81a on an exposure mask 81 is aligned use the alignment mark 73b as the reference point. This alignment can be made using alignment mark 73b formed concurrently with the formation of the device area layer 73a by the so-called direct alignment technique because of the step contour necessary for the alignment. The alignment precision is thus improved. Then the mask pattern 81a of the exposure mask 81 is transferred to the resist layer 80.

Figure 6F:
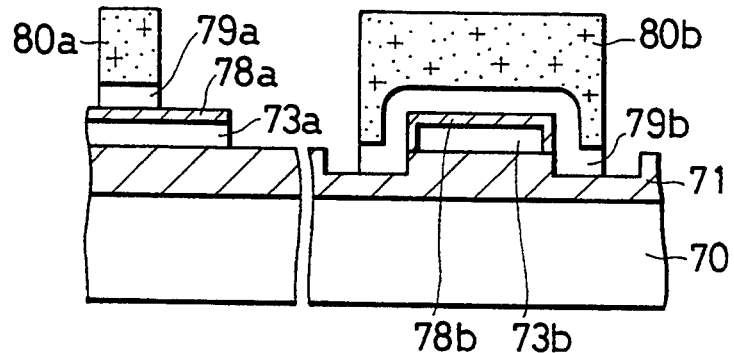

As shown in FIG. 6F, after developing the resist layer 80, the polysilicon layer 79 is selectively etched using the patterned resist layers 80a and 80b as the mask to form a gate electrode 79a on the gate insulating layer 78a on the device area layer 73a. At the same time, a polysilicon layer 79b is formed over the area including the alignment mark 73b.

Figure 6G:
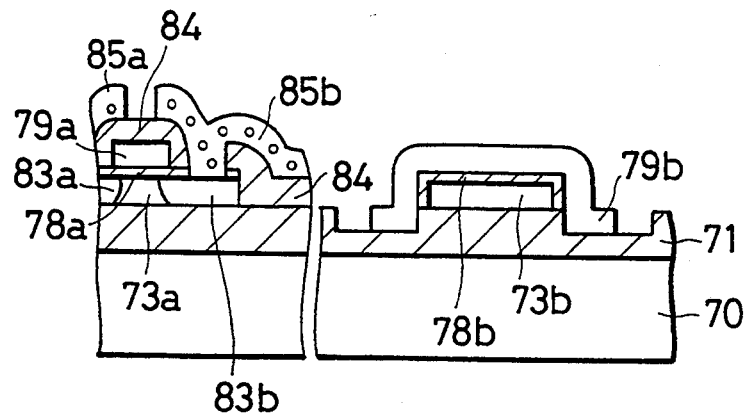

Next, as shown in FIG. 6G, dopant ions are implanted in the device area layer 73a using the gate electrode 79a as the mask so as to form a source region 83a and a drain region 83b. Then, an insulating layer 84 is formed over the gate electrode 79a. Subsequently formed are a source electrode 85a connected to the source region 83a and a drain electrode 85b connected to the drain region 83b. Thus a MOSFET is completed.

As described above, according to the method of fabricating the semiconductor device according to the third embodiment of the present invention, even in the case where the alignment mark 73b formed on the surface of the SOI substrate fabricated by laser recrystallization is thin, the groove 76 is formed around the alignment mark 73b by the selective etching of the silicon oxide layer 71 around the alignment mark 73b, and as a result, the alignment mark 73b can be detected based on its step contour with respect to the groove 76. Thus the so-called direct alignment technique can be performed, and the alignment precision can be improved.

The method of fabricating a semiconductor device according to a fourth embodiment of the present invention is explained with reference to FIGS. 7A to 7G. In this embodiment, an SOI substrate 20 is fabricated by laser recrystallization as in the third embodiment. This embodiment differs from the third embodiment in the method for forming the device area layer and the alignment mark.

FIGS. 7A to 7G are sectional views along the line B—B of FIG. 4B at respective steps during the semiconductor device according to this embodiment. In FIGS. 7A to 7G, common components with the third embodiment have reference numerals common with the third embodiment, and explanation of such components is omitted or summarized.

Figure 7A:
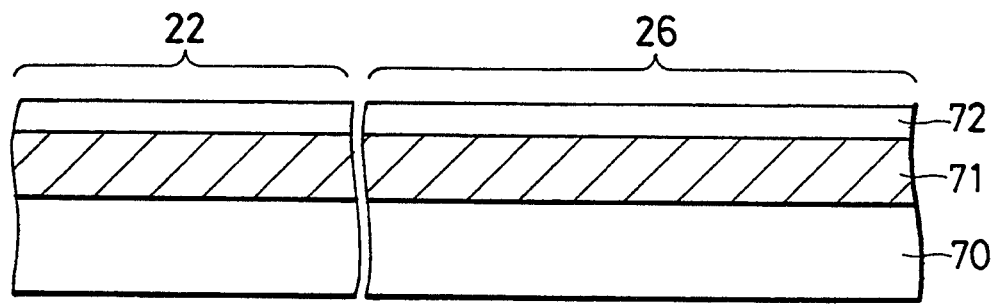
FIGS. 7A to 7G are sectional views for explaining the respective steps involved in the method for fabricating a semiconductor device according to a fourth embodiment of the present invention.

First, as shown in FIG. 7A, a silicon oxide layer 71 is formed on a silicon substrate 70, and then a polysilicon layer 72 is formed thereon. Then the polysilicon layer 72 is melted by a laser beam so as to recrystallize into a monocrystal silicon layer. Thus, an SOI substrate having a monocrystal layer 73 formed on a silicon oxide layer 71 is completed.

The SOI substrate may be formed by a SIMOX (Separation by IMplanted Oxygen) technique in place of the technique as shown in FIG. 7A.

Figure 7B:
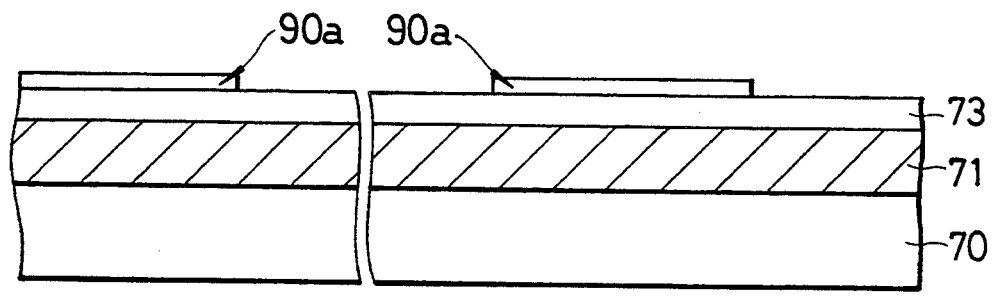

A silicon nitride layer 90, which is an anti-oxidation layer, is formed on the entire surface of the silicon layer. This silicon nitride layer 90 is patterned, as shown in FIG. 7B, to form a silicon nitride device area layer 90a in the device area 22 and a silicon nitride alignment mark layer 90b in the alignment mark area 26.

Figure 7C:
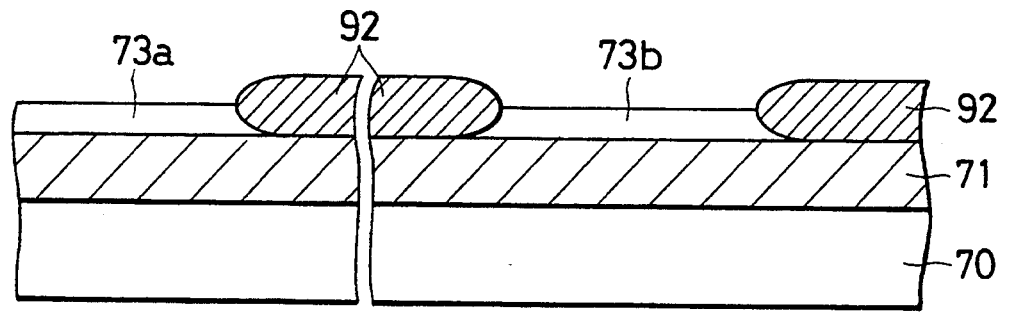

Then a field oxide layer 92 is formed by LOCOS, and then the silicon nitride layers 90a and 90b are removed. Thus, as shown in FIG. 7C, a device area layer 73a and an alignment mark 73b which are isolated by the field oxide layer 92 are formed on the silicon substrate 70.

Figure 7D:
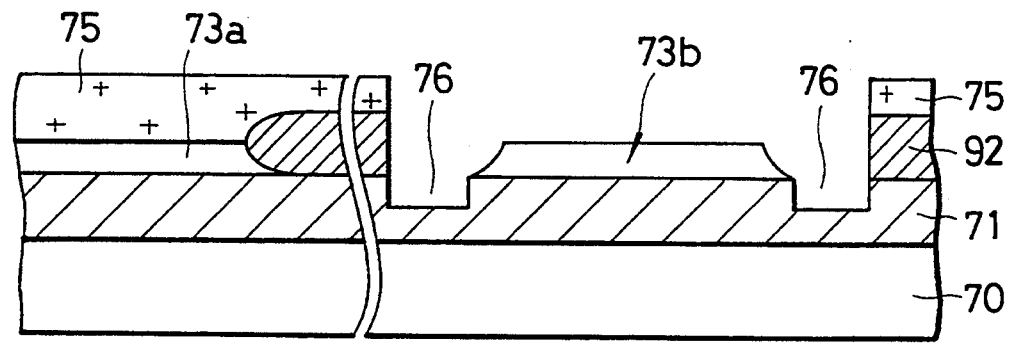

Next, as shown in FIG. 7D, a resist layer 75 is formed on the entire surface, and the resist layer 75 is patterned by photolithography to selectively remove that part of the resist layer 75 in an area about 50 μm wide that includes the alignment mark 73b.

Those parts of the field oxide layer 92 and of the silicon oxide layer 71 around the alignment mark 73b are selectively etched using the patterned resist layer 75 and the alignment mark 73b as the mask by RIE using a mixture of $CF_4$ and $CHF_3$ as the etchant gas. As shown in FIG. 7D, a groove 76 having a depth of about 0.5 μm is thus formed around the alignment mark 73b. A convex portion 77 constituted by the alignment mark 73b and the silicon oxide layer 71a is also formed. The convex portion 77 has the same plane shape as the alignment mark 73b and has a step contour necessary for the alignment.

In FIG. 7D, that part of the silicon oxide layer 71 around the alignment mark 73b may be selectively etched by wet etching using a mixture of HF and H₂O as an etchant in place of RIE. After etching the residual resist layer 75 is removed.

Figure 7E:
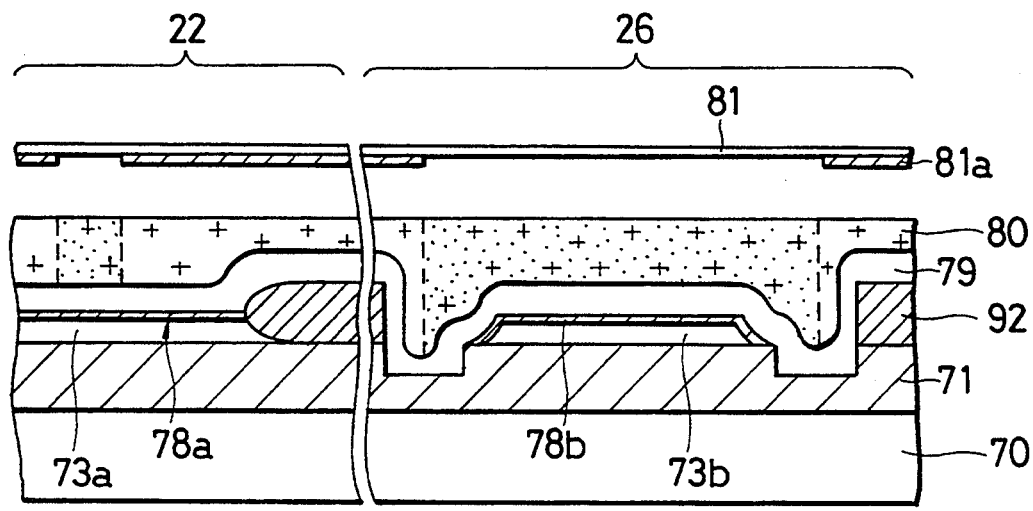
Figure 7F:
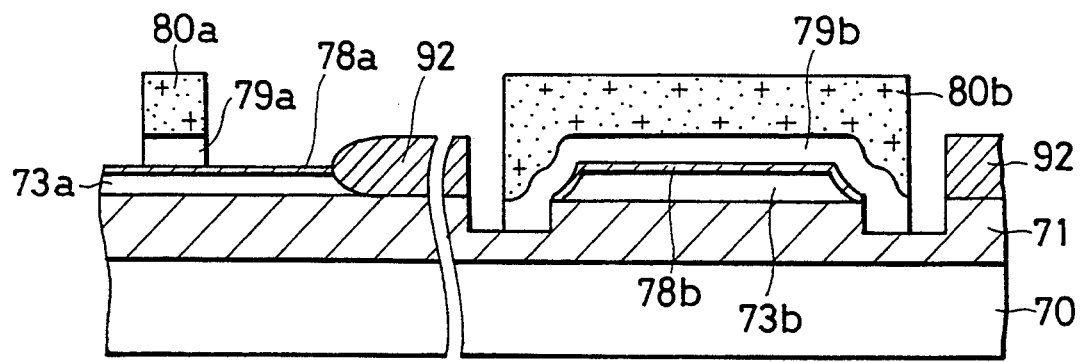

As shown in FIG. 7E, a thin gate insulating silicon oxide layer 78a is formed on the device area layer 73a by thermal oxidation. A thin oxidation layer 78b is formed also on the top and the sides of the alignment mark 73b.

Subsequently a polysilicon layer is formed on the entire surface, and a resist layer 80 is formed on the polysilicon layer 79. Then a mask pattern 81a on an exposure mask 81 is aligned using the alignment mark 73b as the reference point. This alignment can be made by the so-called direct alignment technique using the alignment mark 73b formed concurrently with the device area layer 73a as the reference point because of its step contour necessary for the alignment. As a result the alignment precision is improved. The mask pattern 81a of the exposure mask 81 is then transferred to the resist layer 80.

After developing the resist layer 80, the polysilicon layer 79 is selectively etched using the patterned resist layers 80a and 80b as the mask so as to form a gate electrode 79a on the gate insulating layer 78a on the device area layer 73a. At the same time, a polysilicon layer 79b is formed also on the area covering the alignment mark 73b.

Figure 7G:
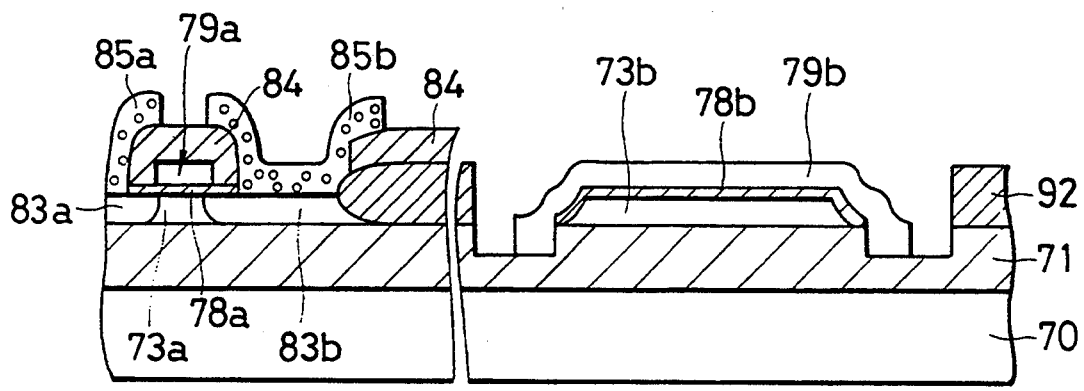

Next, as shown in FIG. 7G, dopant ions are implanted in the device area layer 73a using the gate electrode 79a as the mask to form a source region 83a and a drain region 83b. An insulating layer 84 is formed over the gate electrode 82a. Then a source electrode connected to the source region 83 and a drain electrode connected the drain region 83b are formed. Thus a MOSFET is completed.

As described above, according to the fourth embodiment of the method of fabricating the semiconductor device of the present invention, in a case where the device area layer 73a and the alignment mark 73b are embedded as islands in the field oxide layer 92 formed by LOCOS, parts of the field oxide layer 92 and of the silicon oxide layer 71 are selectively etched using the alignment mark 73b as the mask so as to form the groove 76 around the alignment mark 73b. As a result the alignment mark 73b can be detected by a procedure which includes detecting the step contour of the alignment mark 73b with respect to the groove 76. This makes alignment by the so-called direct alignment technique possible, and the precision of the alignment is improved.

What is claimed is:

1. A method of fabricating a semiconductor device comprising the steps of:
   forming a semiconductor layer having a device area and an alignment mark on an insulating layer;
   selectively etching the insulating layer area around the alignment mark using the alignment mark as a mask so as to form a groove around the alignment mark; and
   aligning a mask pattern using the alignment mark surrounded by the groove as a reference point.

2. A method of fabricating a semiconductor device comprising the steps of:
   etching a first semiconductor substrate to form respective convex device area and alignment mark portions;
   forming an insulating layer over the entire surface so as to cover the convex portions;
   polishing or etching the insulating layer so as to flatten the surface thereof;
   bonding a second semiconductor substrate to the flattened surface of the insulating layer;
   polishing or etching the backside of the first semiconductor substrate to expose the insulating layer and thereby present the device area portion and the alignment mark portion as embedded islands in the insulating layer;
   selectively etching the insulating layer around the alignment mark portion using the alignment mark portion as a mask to form a groove around the alignment mark portion; and
   aligning a mask pattern using the alignment mark portion surrounded by the groove as a reference point.

3. A method of fabricating a semiconductor device comprising the steps of:
   forming anti-oxidation layers on a first semiconductor substrate so as to cover a first area thereof to be a device area and a second area thereof to be an alignment mark area;
   selectively oxidizing the first semiconductor substrate using the anti-oxidation layers as masks to thereby form a field oxide layer around the first and the second areas;
   forming an insulating layer on the entire surface including the first and the second areas;
   polishing or etching the insulating layer to flatten the surface of the insulating layer;
   bonding a second semiconductor substrate to the flattened surface of the insulating layer;
   polishing or etching the backside of the first semiconductor substrate to expose and present the first area and the second area as islands embedded in the field oxide layer;
   selectively etching the field oxide layer around the second area using the second area as a mask to form a groove around the second area; and
   aligning a mask pattern using the second area surrounded by the groove as a reference point.

4. A method of fabricating a semiconductor device comprising the steps of:
   forming anti-oxidation layers on a first semiconductor substrate so as to cover a first area thereof to be a device area and a second area thereof to be an alignment mark area;
   selectively oxidizing the first semiconductor substrate using the anti-oxidation layers as masks to thereby form a field oxide layer around the first and the second areas;
   forming an insulating layer on the entire surface of the substrate including the first and the second areas;
   forming a polysilicon layer on the insulating layer;
   polishing or etching the polysilicon layer to flatten the surface of the polysilicon layer;
   bonding a second semiconductor substrate to the flattened surface of the polysilicon layer;
   polishing or etching the backside of the first semiconductor substrate to expose and present the first area and the second area as islands embedded in the field oxide layer;

selectively etching the field oxide layer around the second area using the second area as a mask to form a groove around the second area; and aligning a mask pattern using the second area surrounded by the groove as a reference point.

5. A method of fabricating a semiconductor device comprising the steps of:

forming a semiconductor layer on an insulating layer on a semiconductor substrate;

patterning the semiconductor layer to form a device area and an alignment mark;

etching the insulating layer around the alignment mark using the alignment mark as a mask so as to form a groove around the alignment mark; and aligning a mask pattern using the alignment mark surrounded by the groove as a reference point.

6. A method of fabricating a semiconductor device comprising the steps of:

forming a semiconductor layer on an insulating layer on a semiconductor substrate;

forming anti-oxidation layers on the semiconductor layer so as to cover a first area thereof to be a device area and a second area thereof to be an alignment mark area;

selectively oxidizing the semiconductor layer using the anti-oxidation layer as masks to thereby form field oxidation layers around the first and second areas;

selectively etching the field oxidation layer around the second area using the second area as a mask to form a groove around the second area; and aligning a mask pattern with the second area surrounded by the grooves as a reference point.

7. A method of fabricating a semiconductor device according to claim 1, wherein the groove around the alignment mark is formed by reactive ion etching.

8. A method of fabricating a semiconductor device according to claim 2, wherein the groove around the alignment mark is formed by reactive ion etching.

9. A method of fabricating a semiconductor device according to claim 3, wherein the groove around the second area is formed by reactive ion etching.

10. A method of fabricating a semiconductor device according to claim 4, wherein the groove around the second area is formed by reactive ion etching.

11. A method of fabricating a semiconductor device according to claim 5, wherein the groove around the alignment mark is formed by reactive ion etching.

12. A method of fabricating a semiconductor device according to claim 6, wherein the groove around the second area is formed by reactive ion etching.

13. A method of fabricating a semiconductor device according to claim 1, wherein the groove around the alignment mark is formed by wet etching.

14. A method of fabricating a semiconductor device according to claim 2, wherein the groove around the alignment mark is formed by wet etching.

15. A method of fabricating a semiconductor device according to claim 3, wherein the groove around the second area is formed by wet etching.

16. A method of fabricating a semiconductor device according to claim 4, wherein the groove around the second area is formed by wet etching.

17. A method of fabricating a semiconductor device according to claim 5, wherein the groove around the alignment mark is formed by wet etching.

18. A method of fabricating a semiconductor device according to claim 6, wherein the groove around the second area is formed by wet etching.

19. A method of fabricating a semiconductor device comprising the steps of:

etching a first semiconductor substrate to form respective convex device area and alignment mark portions;

forming an insulating layer over the entire surface so as to cover the convex portions;

providing a flattened surface over the insulating layer;

bonding a second semiconductor substrate to the flattened surface;

polishing or etching the backside of the first semiconductor substrate to expose the insulating layer and thereby present the device area portion and the alignment mark portion as embedded islands in the insulating layer;

selectively etching the insulating layer around the alignment mark portion using the alignment mark portion as a mask to form a groove around the alignment mark portion; and aligning a mask pattern using the alignment mark portion surrounded by the groove as a reference point.

* * * * *